United States Patent
Yan et al.

(10) Patent No.: US 9,053,993 B2
(45) Date of Patent: Jun. 9, 2015

(54) IMAGING SYSTEMS WITH SELECTABLE COLUMN POWER CONTROL

(75) Inventors: Hai Yan, San Ramon, CA (US); Ashirwad Bahukhandi, San Jose, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 80 days.

(21) Appl. No.: 13/485,867

(22) Filed: May 31, 2012

(65) Prior Publication Data

US 2013/0134295 A1    May 30, 2013

Related U.S. Application Data (60) Provisional application No. 61/544,833, filed on Oct. 7, 2011.

(51) Int. Cl.
| | | |
|---|---|---|
| H04N 5/335 | (2011.01) | |
| H01L 27/00 | (2006.01) | |
| H01L 27/146 | (2006.01) | |
| H04N 5/345 | (2011.01) | |
| H04N 5/369 | (2011.01) | |

(52) U.S. Cl.
CPC ............. *H01L 27/146* (2013.01); *H04N 5/345* (2013.01); *H04N 5/3698* (2013.01)

(58) Field of Classification Search
CPC ... H04N 5/3742; H04N 5/3658; H04N 9/045; H04N 3/155; H04N 5/341; H04N 5/37457; H04N 5/378; H01L 27/14609
USPC .................... 348/230.1, 229.1, 296, 294, 302
See application file for complete search history.

(56) References Cited

U.S. PATENT DOCUMENTS

| | | | |
|---|---|---|---|
| 7,723,661 B2 | 5/2010 | Hara et al. | |
| 7,728,893 B2 | 6/2010 | Kagawa et al. | |
| 8,031,247 B2 | 10/2011 | Borg | |
| 2007/0146514 A1 | 6/2007 | Maeda et al. | |
| 2009/0166513 A1 | 7/2009 | Abe et al. | |
| 2009/0231479 A1* | 9/2009 | Zarnowski et al. | 348/302 |

(Continued)

FOREIGN PATENT DOCUMENTS

| | | |
|---|---|---|
| CN | 101132487 | 2/2008 |
| CN | 101600057 | 12/2009 |

(Continued)

*Primary Examiner* — James Hannett
*Assistant Examiner* — Padma Haliyur
(74) *Attorney, Agent, or Firm* — Treyz Law Group; Louis R. Levenson; Michael H. Lyons

(57) ABSTRACT

Electronic devices may include image sensors having image pixel arrays with image pixels arranged in pixel rows and pixel columns. Each pixel column may be coupled to a column line having column readout circuitry. The column readout circuitry on each column line may include signal processing circuitry and a latch circuit. The latch circuit on each column line may be used to selectively enable and disable the signal processing circuitry on that column line. Each latch circuit may be coupled to first and second signal lines for globally enabling and disabling the signal processing circuitry on all of the column lines. Each latch circuit may be coupled to column decoder circuitry. The column decoder circuitry may provide a column-select signal to latch circuits on a chosen subset of column lines that enables the signal processing circuitry on those column lines by setting those latch circuits.

20 Claims, 6 Drawing Sheets

(56) References Cited

U.S. PATENT DOCUMENTS

| | | | |
|---|---|---|---|
| 2009/0303362 A1* | 12/2009 | Ebihara | 348/296 |
| 2010/0149392 A1 | 6/2010 | Hara | |
| 2010/0213350 A1* | 8/2010 | Shikanai | 250/208.1 |
| 2011/0157444 A1* | 6/2011 | Gerstenberger et al. | 348/308 |

FOREIGN PATENT DOCUMENTS

| | | |
|---|---|---|
| CN | 101815178 | 8/2010 |
| TW | 1326553 | 6/2010 |

\* cited by examiner

IMAGING SYSTEMS WITH SELECTABLE COLUMN POWER CONTROL

This application claims the benefit of provisional patent application No. 61/544,833, filed Oct. 7, 2011, which is hereby incorporated by reference herein in its entirety.

BACKGROUND

This relates generally to imaging devices, and more particularly, to imaging devices with column circuitry.

Image sensors are commonly used in electronic devices such as cellular telephones, cameras, and computers to capture images. In a typical arrangement, an electronic device is provided with an array of image pixels arranged in pixel rows and pixel columns. Circuitry is commonly coupled to each pixel column for reading out image signals from the image pixels. In a typical image sensor, the column readout circuitry that is coupled to all of the pixel columns in a pixel array is typically powered on.

In some situations, however, only a portion of the image pixels a pixel array may used to capture image data at any given time. For example, in some situations a sub-array of image pixels may be used to capture image data when it is desired to capture image frames having a reduced size at an increased frame rate. In a conventional image sensor, power that could otherwise be used to operate other portions of the imaging system or that could otherwise be stored and used for later imaging operations can therefore be used to unnecessarily power column readout circuits that are coupled to unused image pixels. It can be particularly useful to conserve this type of power in portable imaging systems that use batteries to provide power to the device or in power-saving modes in larger electronic devices with imaging systems.

It would therefore be desirable to be able to provide imaging devices with improved column circuitry.

DETAILED DESCRIPTION

Electronic devices such as digital cameras, computers, cellular telephones, and other electronic devices include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements. Readout circuitry may include selectable readout circuitry coupled to each column of pixels that can be enabled or disabled to reduce power consumption in the device and improve pixel readout operations.

Figure 1:
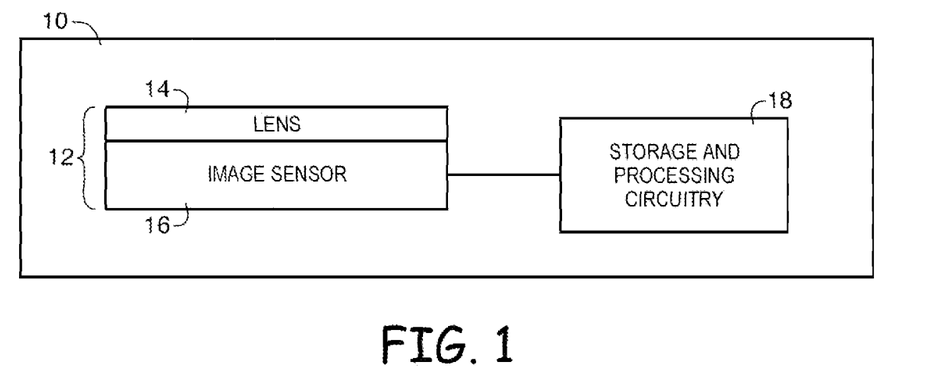
FIG. 1 is a diagram of an illustrative electronic device having an imaging system in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 by lens 14. Image sensor 16 may include circuitry for converting analog pixel data into corresponding digital image data to be provided to processing circuitry 18. If desired, camera module 12 may be provided with an array of lenses 14 and an array of corresponding image sensors 16.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Figure 2:
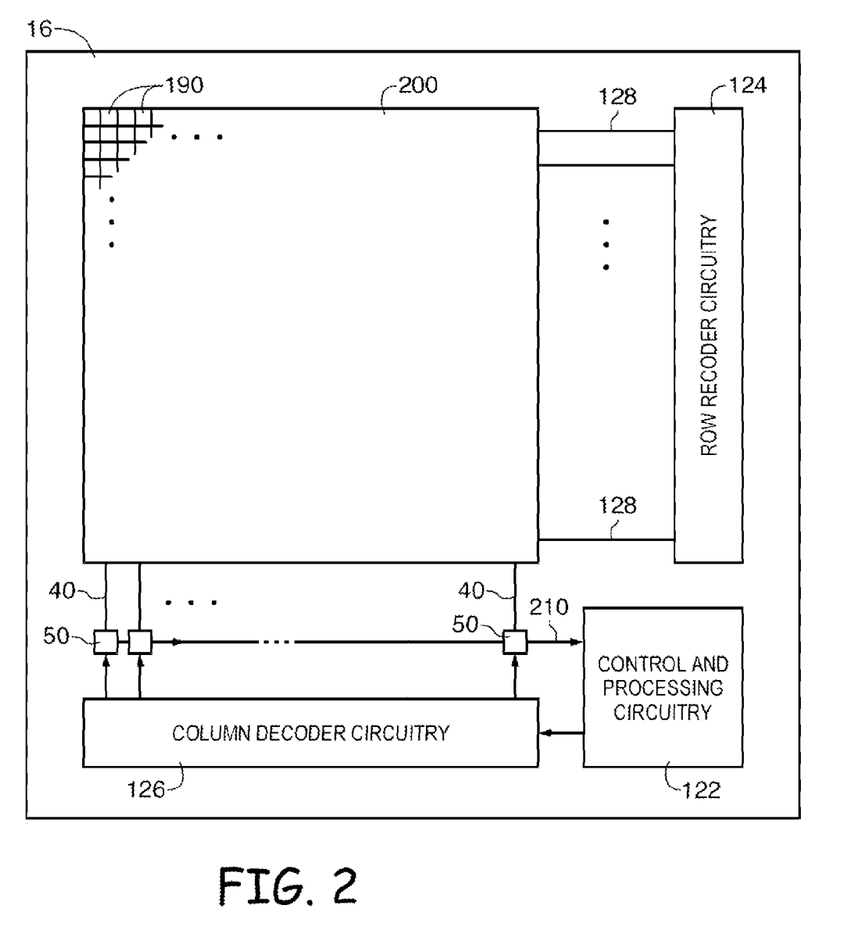
FIG. 2 is a diagram of an illustrative pixel array and associated control circuitry for powering image pixel circuitry and for reading out pixel data from image pixels along column lines in an image sensor in accordance with an embodiment of the present invention.

As shown in FIG. 2, image sensor 16 may include a pixel array 200 containing image sensor pixels 190 and control and processing circuitry 122. Array 200 may contain, for example, hundreds or thousands of rows and columns of image sensor pixels 190. Control circuitry 122 may be coupled to row decoder circuitry 124 and column decoder circuitry 126. Row decoder circuitry 124 may receive row addresses from control circuitry 122 and supply corresponding row control signals such as reset, row-select, transfer, and read control signals to pixels 190 over control paths 128. One or more conductive lines such as column lines 40 may be coupled to each column of pixels 190 in array 200. Column lines 40 may be used for reading out image signals from pixels 190 and for supplying bias signals (e.g., bias currents or bias voltages) to pixels 190. During pixel readout operations, a pixel row in array 200 may be selected using row decoder circuitry 124 and image data associated with image pixels 190 in that pixel row can be read out along column lines 40.

Each column line 40 may include column circuitry such as column control and readout circuitry 50. Column circuitry 50 may include sample-and-hold circuitry, amplifier circuitry, analog-to-digital conversion circuitry, bias circuitry, column memory, latch circuitry for selectively enabling or disabling the column circuitry, or other circuitry for operating pixels 190 and for reading out image signals from pixels 190. Column circuitry 50 may be used to selectively provide power to column circuitry on a selected subset of column lines 40. Latch circuits in column circuitry 50 may be used to dynamically turn on or turn off column readout circuits 50 to reduce power consumption in, for example, windowing or sub-sampling modes of operation of image sensor 16. Column circuits 50 may each include per-column column-latches to help enable only the column readout circuits that are needed in a particular mode of operation while keeping other column readout circuits off. Column latches in column circuitry 50 may be controlled globally or individually during imaging operations.

Readout circuitry such as signal processing circuitry associated with column circuitry 50 (e.g., sample-and-hold circuitry and analog-to-digital conversion circuitry) may be used to supply digital image data to processor 18 (FIG. 1) over path 210 for pixels in chosen pixel columns.

Figure 3:
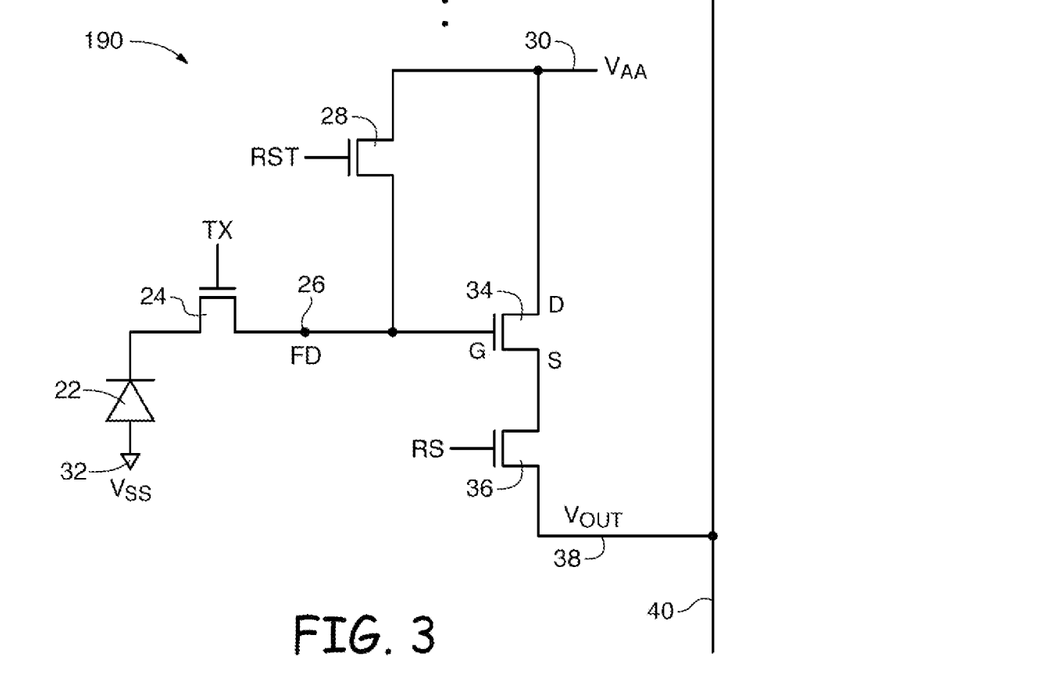
FIG. 3 is a diagram of an illustrative image sensor pixel in accordance with an embodiment of the present invention.

Circuitry in an illustrative pixel of one image sensors 16 is shown in FIG. 3. As shown in FIG. 3, pixel 190 includes a photosensitive element such as photodiode 22. A positive power supply voltage (e.g., voltage Vaa) may be supplied at positive power supply terminal 30. A ground power supply voltage (e.g., Vss) may be supplied at ground terminal 32. Incoming light may be collected by a photosensitive element such as photodiode 22 after passing through a color filter structure. Photodiode 22 converts the light to electrical charge.

Before an image is acquired, reset control signal RST may be asserted. This turns on reset transistor 28 and resets charge storage node 26 (also referred to as floating diffusion FD) to Vaa. The reset control signal RST may then be deasserted to turn off reset transistor 28. After the reset process is complete, transfer gate control signal TX may be asserted to turn on transfer transistor (transfer gate) 24. When transfer transistor 24 is turned on, the charge that has been generated by photodiode 22 in response to incoming light is transferred to charge storage node 26. Charge storage node 26 may be implemented using a region of doped semiconductor (e.g., a doped silicon region formed in a silicon substrate by ion implantation, impurity diffusion, or other doping techniques). The doped semiconductor region (i.e., the floating diffusion FD) exhibits a capacitance that can be used to store the charge that has been transferred from photodiode 22. The signal associated with the stored charge on node 26 is conveyed to row select transistor 36 by source-follower transistor 34.

When it is desired to read out the value of the stored charge (i.e., the value of the stored charge that is represented by the signal at the source S of transistor 34), row select control signal RS can be asserted. When signal RS is asserted, transistor 36 turns on and a corresponding signal Vout that is representative of the magnitude of the charge on charge storage node 26 is produced on output path 38. In a typical configuration, there are numerous rows and columns of pixels such as pixel 190 in array 20. When signal RS is asserted in a given row, a path such as column line 40 can be used to route signal Vout from that pixel to readout circuitry such as column readout circuitry 50.

Figure 4:
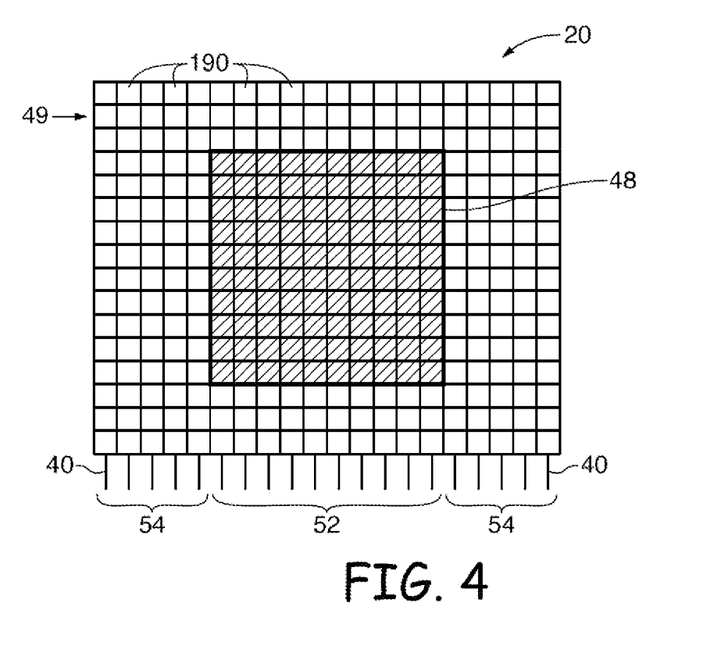
FIG. 4 is a diagram of an illustrative image sensor pixel array showing how a subset of column lines may be used for reading out pixel data from a sub-array of image sensor pixels in some modes of operation in accordance with an embodiment of the present invention.

As shown in FIG. 4, in some modes of operation, only a portion of pixel array 200 such as sub-array 48 may be used in capturing image data. Image pixels 190 in sub-array 48 may be coupled to set of active column lines 52. Image pixels 190 that are outside of sub-array 48 may be coupled to a set of inactive column lines 54. Active column lines 52 may be enabled using column circuitry such as circuitry 50 of FIG. 2. Inactive column lines 54 may be disabled using column circuitry such as circuitry 50. In some modes of operation, a dummy pixel row such as pixel row 49 may selected while some column lines are enabled or disabled.

Sub-array 48 of FIG. 4 is merely illustrative. If desired, active column lines 52 may be coupled to any set of chosen pixel columns. If desired active column lines 52 (e.g., column lines coupled to sub-array 48) may be located in a central portion of array 200, near an edge of portion of array 200, or in any suitable location in array 200. Sub-array 48 may include a set of contiguous pixels or may include pixels that are separated from other pixels in sub-array 48 by pixels that are coupled to some of inactive column lines 54. Sub-array 48 may include a first subset of image pixels for capturing a first image, a second, different set of image pixels for capturing a second image, etc.

Figure 5:
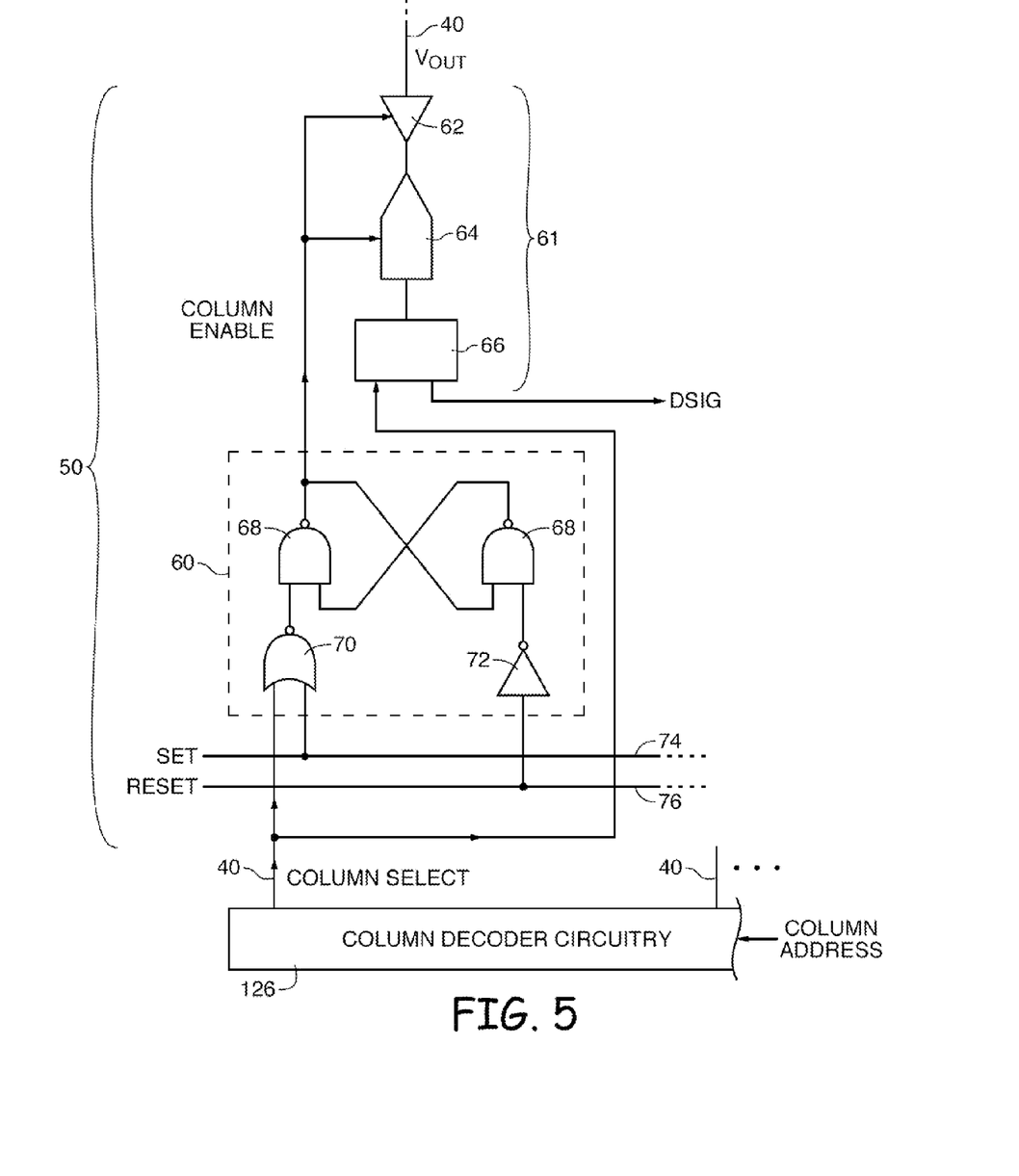
FIG. 5 is a diagram of illustrative column readout circuitry having signal processing circuitry and a latch circuit for enabling and disabling the signal processing circuitry in accordance with an embodiment of the present invention.

FIG. 5 shows an arrangement that may be used in implementing column circuitry 50. As shown in FIG. 5, each column line 40 may include column circuitry 50 that is coupled to column decoder circuitry 126. Column circuitry 50 may include latch circuitry 60 and signal processing circuitry 61. Signal processing circuitry 61 may include circuitry such as amplifier 62, analog-to-digital (ADC) converter 64, and column memory 66. A pixel signal such as signal voltage Vout may be amplified using amplifier 62 and converted into a digital pixel signal DSIG using ADC converter 64. Digital signal DSIG from a given image pixel may be temporarily stored in column memory 66 before being read out to additional circuitry such as control and processing circuitry 122 of FIG. 2.

Latch circuitry 60 may be used to selectively enable or disable signal processing circuitry 61 by selectively providing power to circuitry 61. As shown in FIG. 5, latch circuitry 60 may include a set-reset latch circuit having one or more logical gates such as cross-coupled logical not-and (NAND) gates 68, logical not-or (NOR) gate 70, and one or more inverting buffers such as inverter 72. In the example of FIG. 5, NOR gate 70 includes a first input terminal for receiving a global set signal SET over signal line 74 and a second input terminal for receiving a column-select signal col_select over column line 40 from column decoder circuitry 126. Column decoder circuitry 126 may receive one or more column addresses col_address from circuitry 122 (FIG. 2) and, based on the received column addresses, provide signals col_select to the columns associated with those column addresses. Column-select signal col_select may also be provided to column memory 66 when it is desired to readout digital pixel signal DSIG.

Upon receiving either global set signal SET or column-select signal col_select, NOR gate 70 may provide a signal to an input terminal of a first one of NAND gates 68, thereby allowing an enabling signal col_enable to be provided from an output terminal of that NAND gate 68 to circuitry 61, thereby powering on signal processing circuitry 61. Upon receiving a reset signal RESET over signal line 76 at an input terminal, inverter 72 may provide a signal from an output terminal of inverter 72 to an input terminal of a second one of NAND gates 68, thereby allowing that NAND gate to provide an signal from an output terminal of that NAND gate to an additional input terminal of the associated cross-coupled NAND gate, thereby turning off power to circuitry 61.

Latch circuits 60 that are coupled to each column line 40 can be globally set or reset respectively by providing global control signals SET or RESET to latch circuits 60. The SET signal can be pulsed globally in situations in which it is desired to to bypass the per-column power saving capability of image sensor 16 and keep column circuitry 50 on all column lines 40 powered on.

In situations in which a subset of pixel columns is to be used in a per-column power saving mode of operation, reset signal RESET may be pulsed to reset all column-latches 60 disabling all the column readout circuits 50 (e.g., immediately after a change in operational mode from a full resolution mode to a windowing mode). A dummy pixel row (e.g., a pixel row including pixels that are not to be readout for imaging) may be selected (e.g., using row decoder circuitry 124 of FIG. 2). While the dummy pixel row is selected, signal col_select may be pulsed for a selected subset of pixel columns based on column addresses received from circuitry 122 for that selected subset of pixel columns. The column-select signal provided by the column decoder sets the corresponding column latch and enables the corresponding column readout circuit for readout operations of subsequently selected pixel rows (e.g., pixel rows having active pixels to be used for imaging). As a result, the corresponding column latch circuit may be set and the corresponding column readout circuit thereby turned on.

Because column readout circuits 50 are controlled by their respective latch circuits 60, the corresponding column readout circuits that have been enabled will remain on for subsequent row reading until latch circuitry 60 is given a different set of signals. Column circuitry 50 on pixel columns that were not addressed while the dummy pixel row was selected may remain powered off. However, the configuration of latch circuitry 60 of FIG. 5 is merely illustrative. If desired, column circuitry 50 may be provided with latch circuitry for selectively enabling and/or disabling signal processing circuitry 61 that includes any suitable combination of logical gates such as NOR gates, NAND gates, AND gates, OR gates, inverting buffers, buffers, XOR gates, and/or XAND gates.

Figure 6:
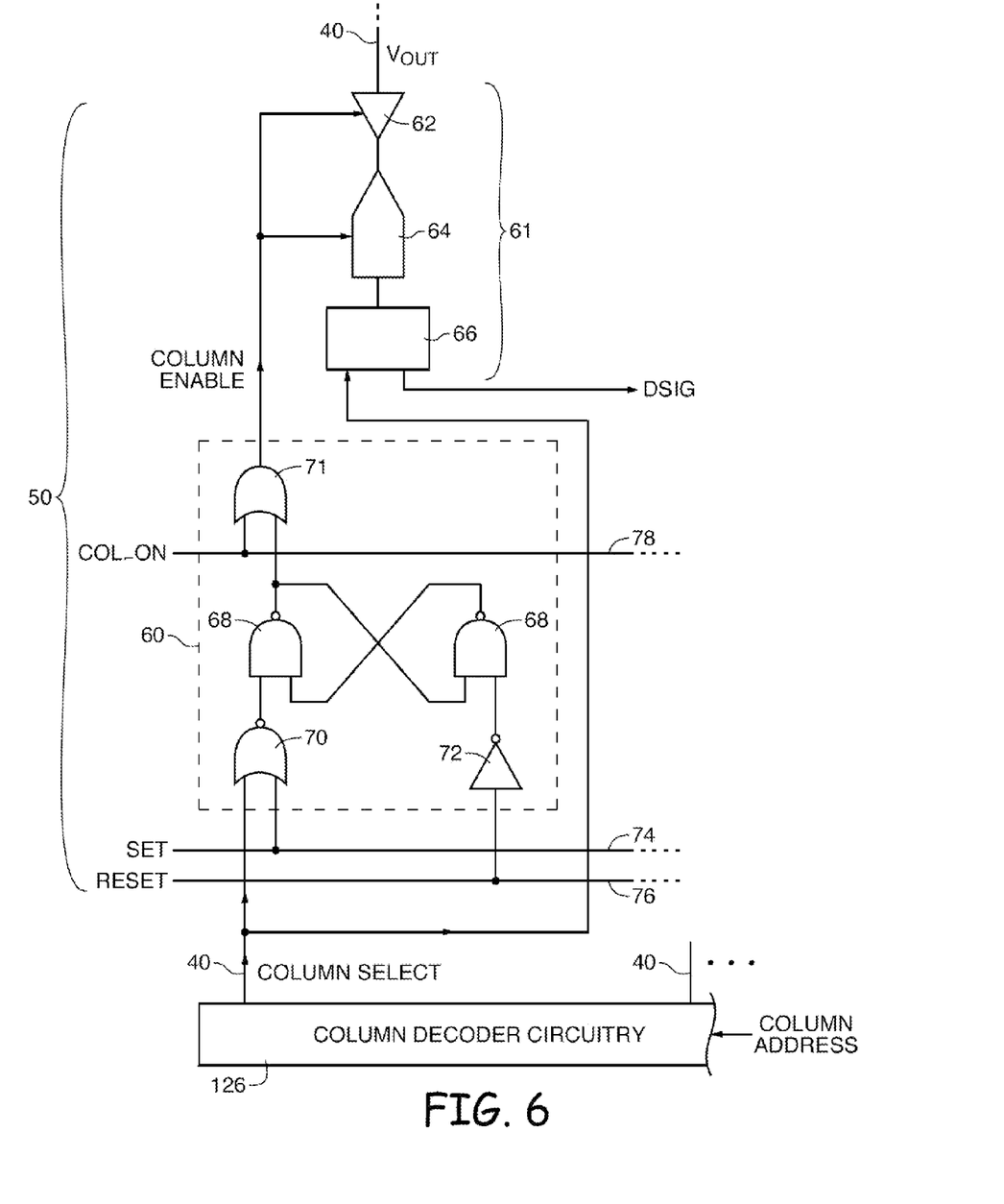
FIG. 6 is a diagram of illustrative column readout circuitry having signal processing circuitry and a latch circuit with an additional logical gate for enabling and disabling the signal processing circuitry in accordance with an embodiment of the present invention.

As shown in FIG. 6, latch circuitry 60 may be provided with an additional logical gate such as OR gate 71. OR gate 71 may have an output terminal that is coupled to signal processing circuitry 61 for providing enabling signal col_enable to circuitry 61, a first input terminal coupled to the output terminal of one of NAND gates 68, and a second input terminal that is coupled to a signal line 78 for providing a global column enable signal col_on to latch circuitry 60 on all column lines 40. In this way, the status of all column latch circuits 60 may be gated by signal col_on.

During operation of pixel array 200, all columns readout circuits 50 may be enabled by asserting signal col_on during readout of a first row of pixels having active pixels to be used for imaging (e.g., a first row of pixels to be read out after a mode change). Pixel signals for all pixels in the first row of pixels may be read out, for example, to column memory 66. Signal col_on may be de-asserted. Column-select signal col_select may then be provided to latch circuitry 60 and column memory 66 for a selected subset of pixel columns in response to corresponding signals col_select. In this way, during transfer of pixel signals DSIG, latch circuits 60 in column readout circuitry 50 on a chosen subset of column lines 40 may be set and column latch circuits 60 may take over per-column power control for readout of subsequent pixel rows.

Figure 7:
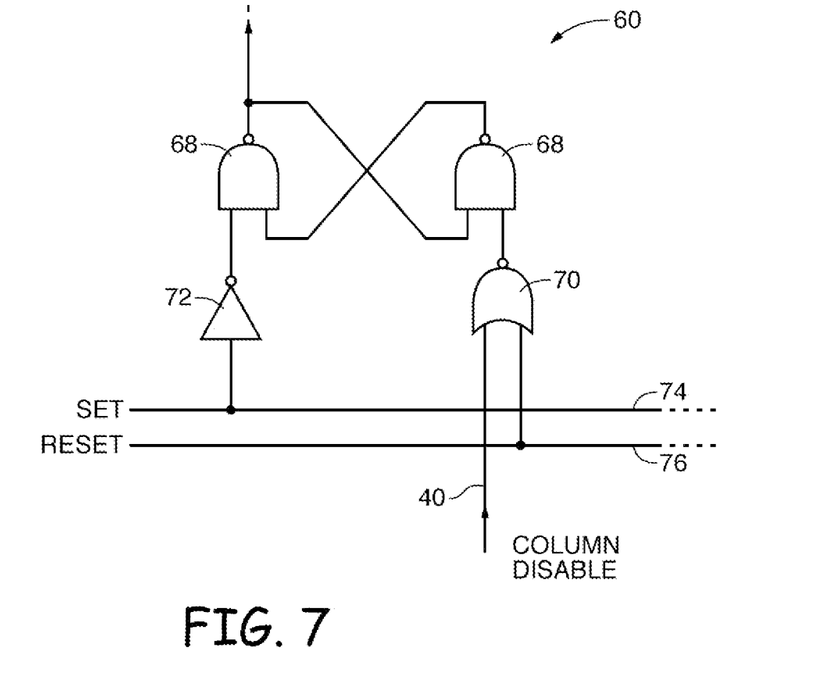
FIG. 7 is a diagram of a column latch circuit for enabling and disabling column readout circuitry in accordance with an embodiment of the present invention.

As shown in FIG. 7, if desired, latch circuitry 60 may be provided with a gate such as NOR gate 70 having input terminals for receiving global reset signal RESET over signal line 76 and column-select signal col_select over column line 40. In this type of configuration, latch circuitry 60 may be provided with an inverter 72 having an input terminal that is coupled to signal line 74 and an output terminal that is coupled to a logical gate such as NAND gate 68 having an output terminal that is coupled to signal processing circuitry 61.

In this type of configuration, column circuitry on a selected subset of column lines 40 may be enabled by first enabling column circuitry on all column lines 40 and subsequently disabling column circuitry on some of column lines 40. For example, column circuitry on all column lines 40 may be enabled by asserting signal SET and column circuitry on column lines 40 that are coupled to pixel columns that are not to be used for imaging in a given mode of operation may then be disabled by providing a disable signal col_disable to latch circuits 60 on those columns. If desired, disable signals col_disable may be provided to latch circuits 60 on unused columns for a given operational mode while selecting a dummy pixel row.

Figure 8:
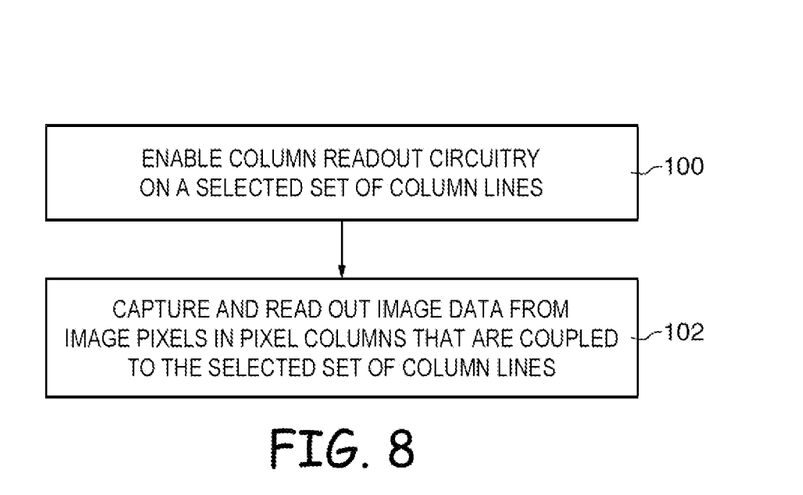
FIG. 8 is a flow chart of illustrative steps that may be used in operating an imaging system having per-column power control circuitry in accordance with an embodiment of the present invention.

Illustrative steps that may be used in operating an electronic device such as device 10 having an image sensor with per-column latch circuitry are shown in FIG. 8.

At step 100, column readout circuitry on a selected set of column lines may be enabled. The selected set of column lines may be coupled to pixel columns having pixels in sub-array of an array of image pixels. The sub-array of image pixels may include selected image pixels to be used in imaging operations for a windowing or motion tracking mode of operation for the electronic device (as examples).

At step 102, image data may be captured and read out from image pixels in pixel columns that are coupled to the selected set of column lines.

Figure 9:
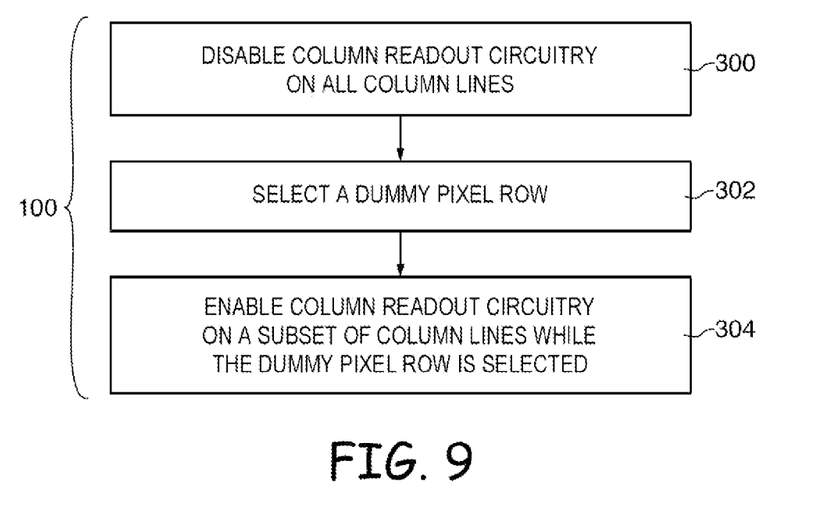
FIG. 9 is a flow chart of illustrative steps that may be used in selectively enabling column readout circuitry on column lines of an image sensor pixel array using a dummy pixel row in accordance with an embodiment of the present invention.

Illustrative steps that may be used in enabling column readout circuitry on a selected set of column lines as described above in connection with step 100 of FIG. 8 are shown in FIG. 9.

At step 300, column readout circuitry on all column lines may be disabled. Disabling column readout circuitry on all column lines may include providing a global reset signal to latch circuitry in column readout circuitry on all column lines.

At step 302, a dummy pixel row may be selected using, for example, row select circuitry such as row decoder circuitry. A dummy pixel row may be a row of image pixels in an image pixel array that is outside of a sub-array of image pixels that are being used for imaging operations in a current mode of operation.

At step 304, column readout circuitry on a subset of column lines may be enabled while the dummy pixel row is selected. Enabling the column readout circuitry on each of the subset of column lines may include providing a column-select signal to a logical gate in a latch circuit in the column readout circuitry on that column line. However, the steps of FIG. 9 are merely illustrative. If desired, column circuitry on a subset of column lines may be enabled without selecting a dummy pixel row.

Figure 10:
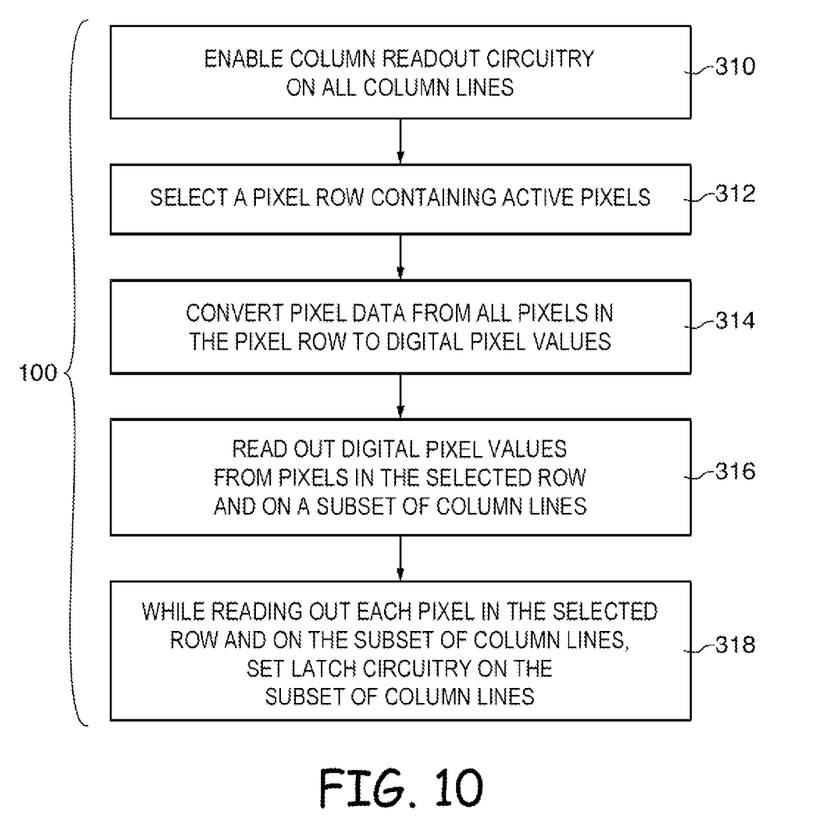
FIG. 10 is a flow chart of illustrative steps that may be used in selectively enabling column readout circuitry on column lines of an image sensor pixel array in accordance with an embodiment of the present invention.

Illustrative steps that may be used in enabling column readout circuitry on a selected set of column lines as described above in connection with step 100 of FIG. 8 without selecting a dummy pixel row are shown in FIG. 10.

At step 310, column readout circuitry on all column lines may be enabled. Enabling column readout circuitry on all column lines may include providing a global enable signal to latch circuitry in the column readout circuitry on each column line.

At step 312, a pixel row containing active pixels (e.g., image pixels within a sub-array of image pixels that are being used for imaging operations in a current mode of operation) may be selected using, for example, row select circuitry such as row decoder circuitry.

At step 314, pixel data from active and inactive pixels in the selected pixel row may be converted to digital pixel values (e.g., using signal processing circuitry such as ADC converter 64 of FIGS. 5 and 6).

At step 316, digital pixel values from image pixels that are in the selected pixel row and in pixel columns on a chosen subset of column lines may be read out (e.g., using column-select circuitry such as column decoder circuitry 126 of FIGS. 2, 4, 5, and 6). The pixel columns on the chosen subset of column lines may be pixel columns that include image pixels in a sub-array of image pixels that are to be used for imaging operations in a current mode of operation.

At step 318, while reading out each image pixel in the selected row and on the subset of column lines, latch circuitry on the subset of column lines may be set. Setting the latch circuitry on each of the subset of column lines may include providing a column-select signal to a gate in the latch circuit on that column line and de-asserting the global enable signal described above in connection with step 310 so that the latch circuit maintains the column readout circuitry on each column line in a corresponding on or off state.

However, the steps described above in connection with FIGS. 9 and 10 are merely illustrative. If desired, for some modes of operation, column circuitry on a subset of column lines (e.g., column lines that are coupled to pixel columns having pixels in a sub-array of image pixels that are to be used in imaging operations in the current mode of operation) may be enabled by first enabling column circuitry on all column lines of an image sensor and subsequently disabling column circuitry on column lines that are coupled to pixel columns that are not to be used for imaging operations in that mode of operation.

Various embodiments have been described illustrating electronic devices with image sensors having one or more image pixel arrays each with image pixels arranged in pixel rows and pixel columns. Each pixel column of an image pixel array may be coupled to column readout circuitry on an associated conductive column line. The column readout circuitry coupled to each pixel column over the corresponding column line may include signal processing circuitry and a latch circuit for selectively enabling and/or disabling the signal processing circuitry on that column line.

Signal processing circuitry on each column line may include one or more amplifiers, analog-to-digital converters, and/or storage such as column memory. Latch circuitry may include a gate such as a not-and logical gate having inputs (input terminals) coupled to a global signal line and column decoder circuitry for the image pixel array. The latch circuitry may include a pair of cross-coupled not-or gates. The not-and gate may have an output terminal coupled to an input terminal of a first one of the cross-coupled not-or gates. The latch circuitry may include an amplifier having an input terminal coupled to a global signal line and an output terminal coupled to a second one of the cross-coupled not-or gates. If desired, the latch circuitry may include an additional not-and gate having a first input terminal coupled to the output terminal of the first cross-coupled not-or gate and a second input terminal coupled to a third global signal line.

In a first mode of operation for the electronic device, substantially all of the image pixels in the image pixel array may be used to capture image data. In other modes of operation, only a portion of the image pixels in the image pixel array may be used to capture image data. In modes of operation in which only a portion of the image pixels in the image pixel array are to used to capture image data, column readout circuitry on column lines that are coupled to unused pixel columns may be disabled.

Column readout circuitry on column lines that are coupled to unused pixel columns may be disabled using the latch circuitry on those column lines. For example, in some situations, all column circuits may be disabled, a dummy pixel row may be selected, and column readout circuits on a chosen subset of pixel columns may be enabled while the dummy pixel row is selected. In other situations, all column circuits may be enabled, a partially active pixel row may be selected, and latch circuits on a chosen subset of pixel columns may be set while the reading out the active pixels in the partially active pixel row. However, this is merely illustrative. If desired, column circuitry on all column lines may be enabled and column circuitry on column lines that are coupled to pixel columns that are not to be used for imaging operations in a current mode of operation may be selectively disabled by providing disable signals to latch circuitry on selected column lines.

The foregoing is merely illustrative of the principles of this invention which can be practiced in other embodiments.

What is claimed is:

1. An image sensor, comprising:
    an array of image pixels arranged in pixel rows and pixel columns;
    a plurality of column lines, wherein each one of the plurality of column lines is coupled to a corresponding pixel column; and
    a plurality of column readout circuits, wherein each one of the plurality of column readout circuits is coupled to an associated one of the plurality of column lines, wherein each one of the plurality of column readout circuits comprises a corresponding data converting circuit and a corresponding latch circuit, and wherein the corresponding latch circuit is configured to selectively power on the data converting circuit in that column readout circuit by selectively providing a column enabling signal to the data converting circuit in that column readout circuit.

2. The image sensor defined in claim 1 wherein each latch circuit comprises first and second logical gates and wherein the first logical gate is cross-coupled to the second logical gate.

3. The image sensor defined in claim 2 wherein each latch circuit further comprises a third logical gate having an output terminal coupled to an input terminal of the first logical gate, a first input terminal coupled to a first signal line and a second input terminal configured to receive a column-select signal.

4. The image sensor defined in claim 3 wherein each latch circuit further comprises an inverter having an output terminal coupled to an input terminal of the second logical gate and an input terminal coupled to a second signal line.

5. The image sensor defined in claim 4 wherein the first signal line comprises a global signal line configured to provide a first global signal to the latch circuit in each of the plurality of column readout circuits that powers on the data converting circuit in that column readout circuit.

6. The image sensor defined in claim 5 wherein the second signal line comprises an additional global signal line configured to provide a second global signal to the latch circuit in each of the plurality of column readout circuits that powers off the data converting circuit in that column readout circuit.

7. The image sensor defined in claim 6, further comprising: column decoder circuitry coupled to the plurality of column lines, wherein the column decoder circuitry is configured to provide the column-select signal to the second input terminal of the third logical gate in each latch circuit on a selected subset of the plurality of column lines.

8. The image sensor defined in claim 7 wherein each one of the column readout circuits further comprises a corresponding amplifier and corresponding column memory, and wherein the data converting circuit in each of the column readout circuits comprises a corresponding analog-to-digital converter coupled between the amplifier and the column memory in that column readout circuit.

9. The image sensor defined in claim 8 wherein the latch circuit in each of the plurality of column readout circuits is configured to provide a power-on signal from the output terminal of the first logical gate to the data converting circuit in that column readout circuit that powers on the data converting circuit in that column readout circuit.

10. The image sensor defined in claim 9 wherein the column decoder circuitry is further configured to provide the column-select signal to the column memory in each column readout circuit on the selected subset of the plurality of column lines.

11. The image sensor defined in claim 10 wherein the first and second logical gates in each latch circuit comprise respective first and second logical not-or gates and wherein the third logical gate in each latch circuit comprises a logical not-and gate.

12. The image sensor defined in claim 11 wherein the first logical not-or gate in the latch circuit of each column readout circuit comprises an output terminal coupled to the in that column readout circuit.

13. The image sensor defined in claim 11 wherein each latch circuit further comprises:
an additional not-and gate having a first input terminal coupled to the first logical not-or gate and a second input terminal coupled to a third signal line.

14. A method of operating an image sensor having an array of image pixels arranged in pixel rows and pixel columns, a column line coupled to each pixel column, and column readout circuitry on each column line, wherein the column readout circuitry on each column line includes a corresponding latch circuit, the method comprising:
powering off the column readout circuitry on each column line using a first enabling signal provided by the latch circuit in the column readout circuitry on that column line to the column readout circuity on that column line; and
simultaneously powering on the column readout circuitry on a selected subset of the column lines using the second enabling signal provided by the latch circuit in the column readout circuitry on each column line in the selected subset of the column lines to the column readout circuitry on each column line in the selected subset of column lines, wherein the selected subset of the column lines includes at least two column lines.

15. The method defined in claim 14 wherein the image sensor further includes row decoder circuitry configured to select pixel rows, the method further comprising:
selecting a dummy pixel row using the row decoder circuitry, wherein powering on the column readout circuitry on the selected subset of the column lines using the latch circuit in the column readout circuitry on each one of the selected subset of the column lines comprises powering on the column readout circuitry on the selected subset of the column lines using the latch circuit in the column readout circuitry on each one of the selected subset of the column lines while the dummy pixel row is selected.

16. The method defined in claim 14 wherein powering off the column readout circuitry on each column line using the latch circuit in the column readout circuitry on that column line comprises providing a reset signal to the latch circuit in the column readout circuitry on that column line.

17. The method defined in claim 16 wherein powering on the column readout circuitry on the selected subset of the column lines using the latch circuit in the column readout circuitry on each one of the selected subset of the column lines comprises providing a column-select signal to the latch circuit in the column readout circuitry on each of the selected subset of column lines.

18. A method of operating an image sensor having an array of image pixels arranged in pixel rows and pixel columns, a column line coupled to each pixel column, and column readout circuitry on each column line, wherein the column readout circuitry on each column line includes signal processing circuitry and a set-reset latch circuit, the method comprising:
selecting a first pixel row;
selectively powering on the signal processing circuitry on each column line using a column enabling signal generated by a first portion of the set-reset latch circuit in the column readout circuitry on that column line;
reading out digital pixel values associated with image pixels that are in the selected first pixel row and that are in pixel columns that are coupled to a chosen subset of the column lines; and
while reading out the digital pixel values associated with the image pixels that are in the selected first pixel row and that are in the pixel columns that are coupled to the chosen subset of the column lines, setting a second portion of each set-reset latch circuit in the column readout circuitry on the chosen subset of the column lines.

19. The method defined in claim 18 wherein the first portion of each set-reset latch circuit comprises a logical gate having an input terminal coupled to a signal line and wherein powering on the signal processing circuitry on each column line using the first portion of the set-reset latch circuit in the column readout circuitry on that column line comprises providing a global power on signal to the input terminal of the logical gate of the first portion of each set-reset latch circuit.

20. The method defined in claim 19 wherein the second portion of each set-reset latch circuit comprises at least one logical gate configured to receive a column-select signal and wherein setting the second portion of each set-reset latch circuit in the column readout circuitry on the chosen subset of the column lines comprises providing the column-select signal to the at least one logical gate in the second portion of the set-reset latch circuit on the chosen subset of the column lines.

* * * * *